United States Patent
Eleftheriou et al.

(10) Patent No.: US 8,874,993 B2
(45) Date of Patent: Oct. 28, 2014

(54) MEMORY MANAGEMENT IN A NON-VOLATILE SOLID STATE MEMORY DEVICE

(71) Applicant: SK hynix Inc., Gyeonggi-do (KR)

(72) Inventors: Evangelos S Eleftheriou, Zurich (CH); Ilias Iliadis, Zurich (CH); Robert Haas, Zurich (CH); Xiaoyu Hu, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/732,830

(22) Filed: Jan. 2, 2013

(65) Prior Publication Data

US 2013/0191704 A1 Jul. 25, 2013

Related U.S. Application Data

(62) Division of application No. 12/835,783, filed on Jul. 14, 2010, now Pat. No. 8,370,712.

(30) Foreign Application Priority Data

Jul. 23, 2009 (EP) ................................. 09166231.2

(51) Int. Cl.
*G11C 29/00* (2006.01)
*G06F 11/00* (2006.01)

(52) U.S. Cl.
USPC .......................................... 714/763; 714/42

(58) Field of Classification Search
CPC ... G06F 11/008; G06F 11/073; G06F 11/076; G06F 11/1048; G11C 29/42; G11C 29/44; G11C 2029/0411; G11C 13/0004; G11C 13/0033; G11C 29/028; G11C 13/0035; G11C 2029/0409; H04N 19/00; H04N 19/00939; H04N 19/00933
USPC ....................................................... 714/763, 42
See application file for complete search history.

(56) References Cited

U.S. PATENT DOCUMENTS

| | | | |
|---|---|---|---|
| 7,859,932 B2 * | 12/2010 | Mokhlesi ...................... 365/222 |
| 7,934,130 B2 * | 4/2011 | Reid ................................ 714/42 |
| 8,074,011 B2 * | 12/2011 | Flynn et al. ................... 711/103 |
| 8,098,537 B2 * | 1/2012 | Mokhlesi ...................... 365/222 |
| 8,201,053 B2 * | 6/2012 | Aasheim et al. .............. 714/763 |
| 8,291,181 B2 * | 10/2012 | Manning ....................... 711/162 |
| 8,407,559 B2 * | 3/2013 | Yang et al. .................... 714/763 |
| 8,412,987 B2 * | 4/2013 | Billing et al. ................. 714/723 |
| 2009/0077429 A1 * | 3/2009 | Yim et al. ........................ 714/54 |
| 2009/0125671 A1 * | 5/2009 | Flynn et al. .................. 711/103 |
| 2009/0259896 A1 * | 10/2009 | Hsu et al. ...................... 714/723 |
| 2010/0058119 A1 * | 3/2010 | Reid ................................ 714/49 |
| 2010/0106889 A1 * | 4/2010 | Manning ....................... 711/103 |
| 2010/0157671 A1 * | 6/2010 | Mokhlesi ................. 365/185.03 |
| 2010/0235715 A1 * | 9/2010 | Thatcher et al. .............. 714/763 |

(Continued)

*Primary Examiner* — Guerrier Merant
(74) *Attorney, Agent, or Firm* — Cantor Colburn LLP

(57) ABSTRACT

A non-volatile solid state memory device and method for balancing write/erase cycles among blocks to level block usage. The non-volatile solid state memory device includes a memory unit having data stored therein and a controller with logic for programming the memory unit according to a monitored occurrence of an error during a read operation. The method includes monitoring an occurrence of an error during a read operation in a memory unit of the device and programming the memory unit according to the monitored occurrence of the error.

22 Claims, 7 Drawing Sheets

(56) References Cited

U.S. PATENT DOCUMENTS

2010/0332950 A1* 12/2010 Billing et al. .................. 714/768
2011/0026353 A1* 2/2011 Mokhlesi ...................... 365/222
2011/0041038 A1* 2/2011 Aasheim et al. .............. 714/764
2012/0059981 A1* 3/2012 Flynn et al. ................... 711/103
2013/0013981 A1* 1/2013 Manning ....................... 714/773
2013/0219113 A1* 8/2013 Liebowitz et al. ............ 711/103

* cited by examiner

MEMORY MANAGEMENT IN A NON-VOLATILE SOLID STATE MEMORY DEVICE

CROSS-REFERENCE TO RELATED APPLICATIONS

This application is a Divisional of and claims priority under 35 U.S.C. §120 from parent application U.S. patent application Ser. No. 12/835,783 filed Jul. 14, 2010, which in turn claims priority under 35 U.S.C. §119 from European Patent Application No. 09166231.2 filed Jul. 23, 2009. The entire contents of all of these applications are incorporated herein by reference.

BACKGROUND OF THE INVENTION

1. Field of the Invention

The invention relates to the field of computer memory management, and more particularly, the invention relates to the management of non-volatile solid state memory devices.

2. Description of the Related Art

As well-known in computer science, memory can be split into two categories: volatile and non-volatile. Volatile memory loses data when a computer system is turned off. In other words, it requires power to persist. Most types of random access memory (RAM) fall into this category. In contrast, non-volatile memory retains stored information even when a computer system is not powered-on. Usually, solid-state memory falls into the second category.

Non-volatile memory was originally called Read Only Memory (ROM); its loaded contents could be read but not erased or reprogrammed. The ability to erase or reprogram came along with the next generations of devices, namely Electrically Programmable ROM (EPROM), Electrically Erasable and Programmable ROM (EEPROM), and Flash EEPROM—the latter commonly referred to as Flash memory.

ROM memory is programmed at the time of manufacture; it stores permanent code and data (e.g. used to initialize and operate a computer system). EPROM can be electrically programmed one byte at a time but is not easily erasable. Yet, erasing all memory bits can be achieved by exposure to ultraviolet (UV) light. EPROM likely uses a single transistor for each data bit and allows for relatively high density memories. EEPROM is electrically erasable and programmable "in-system", that is, one byte (or word) at a time. However, memory cells use more transistors and are larger than EPROM's. EEPROM has thus higher costs and lower density (e.g. less than 1 MB).

More recently, Flash EEPROM memory have been developed that can be electrically programmed a single byte at a time. Yet, erasing can only be achieved for at least one group of bytes at a time (also called a block or sector). All bytes in a block are electrically erased at the same time. The erase operation is much faster than in prior EPROM or EEPROM devices, whence the name of "Flash". The Flash memory cell uses a single transistor to store one or more bits of information. It achieves the density of EPROM together with the versatility of electrical in-system erase and programmability of EEPROMs.

Furthermore, flash memory offers fast read access times (although generally not as fast as volatile DRAM used in PCs) and better kinetic shock resistance than hard disks. For these reasons, flash memory has become a dominant technology in solid state storage.

Flash memory stores information in an array of memory cells made from floating-gate transistors. In traditional single-level cell (SLC) devices, each cell stores only one bit of information. Some newer flash memory, known as multi-level cell (MLC) devices, can store more than one bit per cell by choosing between multiple levels of electrical charge to apply to the floating gates of its cells.

Apart from that it must be erased a "block" at a time, another limitation is that flash memory has a finite number of erase-write cycles. Most flash products withstand around 100,000 write/erase-cycles, before wear begins to deteriorate integrity of the storage. The guaranteed cycle count may apply only to block zero or to all blocks (depending on the device type).

This effect is partially offset in some chip firmware or file system drivers by counting the writes and dynamically remapping blocks in order to spread write operations between blocks. The technique is called wear-leveling. Typically, a memory unit subdivides into dies (also called IC dies or dice), and each die is composed of blocks. Blocks can be composed of pages, which decompose into cells.

Another approach is to perform write verification and remapping to spare blocks in case of a write failure (bad block management or BBM). These wearout management techniques extend the life of the flash memory for these applications where data loss is acceptable. For high reliability data storage, however, it is generally not advised to use flash memory that would have to go through a large number of programming cycles. Yet, this limitation is meaningless for 'read-only' applications such as thin clients and routers, which are only programmed at most a few times during their lifetime.

For clarity, the following definitions are used:
Bit: The basic unit of memory, "1" or "0";
Byte: A group of 8 bits;
Cell: A physical semiconductor structure that stores one (or more) bit of data;
Write/Erase: The operation of altering an electronic state of (e.g. adding or removing electrons from) the storage medium of a memory cell in order to alter memory bits and so to write or erase encoded data; more generally to write/erase data on the device;
Read: The process of determining the state of the bit cell; more generally to read data stored on the device;
Endurance: Write/erase cycles a memory can endure before failure (typically 10 000 cycles);
Data Retention: Typically a time value pertaining to a memory cell's ability to retain data.

Non-volatile memory cells have some important functional characteristics, which are used to evaluate the performance of the cell. These characteristics are divided into two main classes—endurance and retention. These are the two main challenges that solid-state-based non-volatile memories are faced with.

As mentioned above, endurance is defined as the maximum number of writes/erase cycles that can be performed on each cell before it wears out. When a non-volatile memory cell can no longer hold a charge in the floating gate, its retention capability is affected. Retention is thus a measure of the time that a non-volatile memory cell can retain the charge whether powered or not. Typically, data retention refers to the maximum time period during which the data can be read out, possibly with correctable errors. Endurance is typically specified assuming a ten-year data retention period.

On the one hand, wear-leveling is one of the most widely used techniques to cope with the problem of wear-out. The state-of-the-art of wear-leveling is based on a counter of write/erase cycles per block, aiming at balancing write/erase cycles among blocks so that no block receives excessive write/erase cycles. Wear-leveling is formally illustrated in FIG. 1. In FIG. 1, for a given non-volatile solid state memory device (as provided at step 100), write/erase cycles are monitored for each block of the memory (step 110'). Then, programming the memory (for example implementing wear-leveling, step 140) takes into account the write/erase cycles counted for each block.

On the other hand, if error-correcting codes (ECC) or forward error correction (FEC) codes are known. ECC or FEC denotes code in which each data signal conforms to specific rules of construction such that departures from that construction in the received signal can be automatically detected and corrected. If the number of errors is within the capability of the code being used, the decoder can fix the error by flipping the bits at those locations. ECCs or FECs are used for data retention purposes.

SUMMARY OF THE INVENTION

According to a first aspect of the present invention, a computer-implemented method of managing a memory of a non-volatile solid state memory device by balancing write/erase cycles among blocks to level block usage is provided. The method includes: monitoring an occurrence of an error during a read operation in a memory unit of the device, wherein the error is correctable by error-correcting code; and programming the memory unit according to the monitored occurrence of the error; wherein the step of monitoring the occurrence of an error is carried out for at least one block; and wherein said step of programming comprises wear-leveling the monitored block according the error monitored for the monitored block.

According to a second aspect of the present invention, a non-volatile solid state memory device is provided. The device includes: a memory unit having data stored therein; and a controller with a logic for programming the memory unit according to a monitored occurrence of the error during a read operation.

According to another aspect of the present invention, a computer system is provided for managing a memory of a non-volatile solid state memory device. The device includes: a non-volatile solid state memory device with a memory unit; and an article of manufacture tangibly embodying computer readable instructions which when implemented, causes the computer system to carry out the steps of the method of the present invention.

DETAILED DESCRIPTION OF THE PREFERRED EMBODIMENTS

It will be readily understood that the components of the present invention, as generally described and illustrated in the figures herein, may be arranged and designed in a wide variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

According to an embodiment of the present invention, a method is provided for managing a memory of a non-volatile solid state memory device. The device can be, for example, a flash memory. As described above, wear-leveling is widely used to handle wear-out, based on a counter of write/erase cycles per block. Wear-leveling is performed by balancing write/erase cycles among blocks to level block usage. The embodiment of the present invention provides for monitoring the occurrence of errors in read-out operations. Errors monitored are those errors which are detectable based on ECCs.

Figure 1:
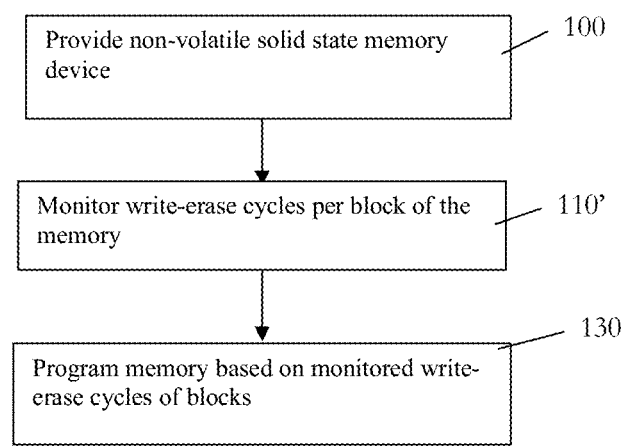
FIG. 1 is a flowchart illustrating typical steps of wear-leveling operations in a non-volatile solid-state memory device.
Figure 2:
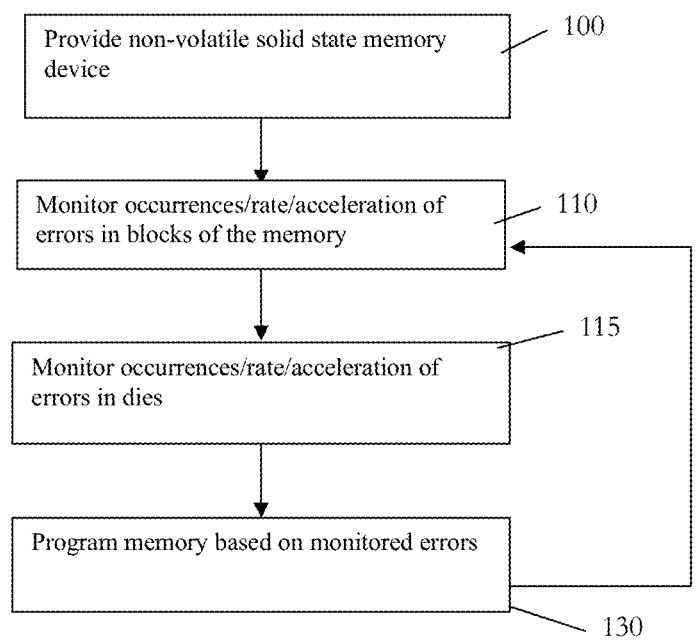
FIG. 2 is another flowchart, reflecting steps of a method of managing a memory of a non-volatile solid state memory device according to an embodiment according to the present invention.

This principle is schematically depicted in FIG. 2. In a device such as a flash memory (as provided in step 100), the occurrence of errors in read operations is monitored (step 110). Subsequent programming of the memory can accordingly advantageously take into account the monitored errors (step 130).

For example, wear-leveling can be implemented according to the monitored errors, which likely evolve with time. This strategy is implemented because endurance cannot be accurately known in advance.

On the contrary, the "end of life" of a block or, generally speaking, a die or unit can be more accurately monitored based on error occurrences. The embodiment according to the present invention involves monitoring rates of errors, and optionally a change in the said rates of the errors (acceleration). Various models can accordingly be designed. How memory programming is impacted by the result of monitoring depends on the type of the solid-state memory device and applications considered. Examples will be discussed below.

Besides wear-leveling applications, the occurrence of errors is monitored in order to determine when the memory approaches its end of life, as will be discussed later in details. This allows for preventing data lost.

Typically, a unit is composed of dice, and each die is made of blocks. The management of memory is performed at least on the block level. Preferably, a similar monitoring function is implemented at the die level (step 115, FIG. 2) and optionally at the unit level (not illustrated here). A unit corresponds e.g. to all memories coupled to a controller.

Block level monitoring provides an indication about the quality of each individual block; this enables changes in the way blocks are used, as suggested by step 130. For instance, blocks with frequent errors may be excluded from subsequent allocation (as in BBM), or may be used according to a scheme providing redundancy. The first of these alternatives is illustrated in FIG. 3.

Figure 3:
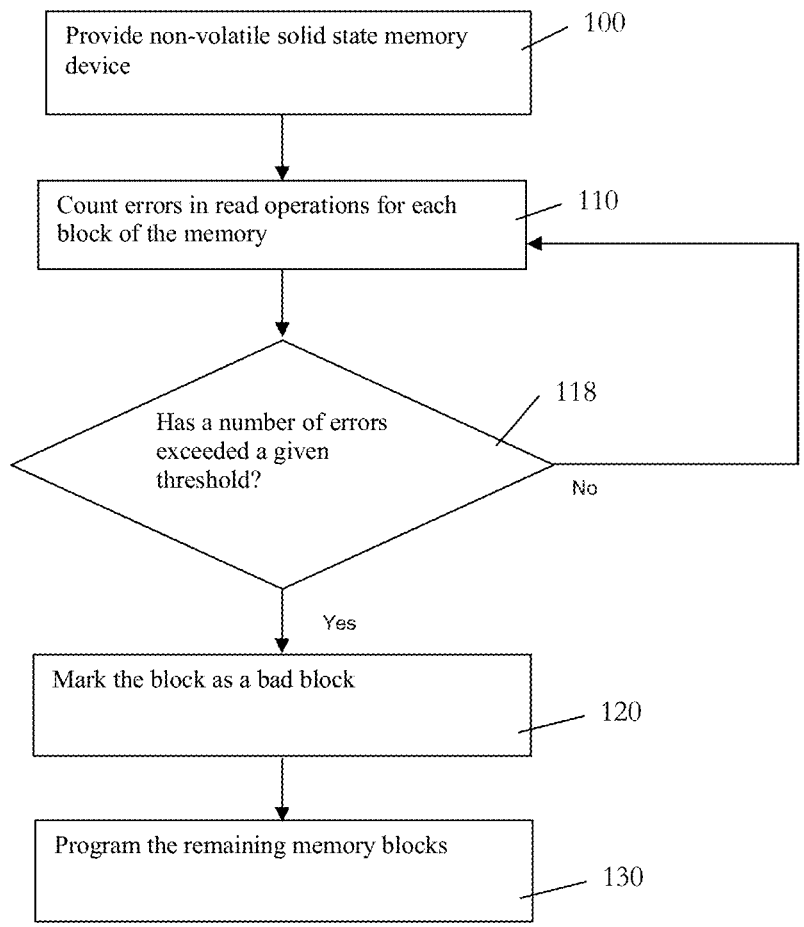
FIG. 3 depicts a variant of FIG. 2.

FIG. 3 illustrates a block management similar to that of FIG. 2, except that:
  monitoring errors in the memory block (step 110, 118) involves (i) counting per block errors (110); and (ii) testing each block to determine whether a threshold is exceeded (118);

If a threshold level has been reached, the corresponding block would then be marked as a bad block (step 120), or else monitoring continues.

Subsequent programming of the blocks is impacted according to whether blocks are marked or not (140). For example, bad blocks are discarded from subsequent allocations.

Die level monitoring enables the identification of problematic dies in the unit (for instance due to bad batches). Unit level monitoring provides an indication to the higher level controller as to the state of the memories in this particular unit. This can be used, for instance, to decide when to replace a unit. The die-level and unit-level information can be made available through a SMART interface to a higher level controller.

The above schemes make use of registers (e.g. maintained by the Flash controller) for keeping track of errors and the rate of the occurrence of errors, at least at the block level (and optionally at the die and unit level). Thus, useful ECC-related additional information is provided that can be used to improve e.g. wear-leveling and thereby the endurance lifetime for individual blocks, die, and unit in solid-based memories.

While the method according to the embodiment of the present invention may be performed using additional registers, it does however not require maintaining per-block counters of write/erase operations, where the computational/storage cost of implementing the present scheme is moderate, if not negligible.

Yet, in a variant, wear-leveling (or more generally any memory programming) can be implemented according to both the errors monitored and the write/erase operation data maintained in per-block counters, which will be discussed below.

According to another embodiment of the present invention, each block that is used contains a register that has one or more counters. In case of a single counter (c1), c1 counts the accumulated number of ECC errors during the reads. If a threshold is exceeded for the accumulated bit errors per block, the block programming is accordingly impacted (see e.g. step 130 or 150 in FIG. 2-5).

Preferably, two counters <c1, c2> can be used. The first counter c1 counts the accumulated number of ECC errors during the reads since c2 was last incremented, and c2 counts the number of times c1 has exceeded a set threshold.

As mentioned, wear-leveling can further be implemented according to both the monitored errors and write/erase operation data. Accordingly, a further refinement to the two-counters scheme is e.g. to reset c1 at the beginning of each write/erase cycle, and hence c2 counts the number of times the threshold was exceeded within write/erase cycles. The whole history is thus reflected in the last counter c2, which is never reset. Incidentally, this principle can be generalized to more than two counters.

As example applications, a block having a small number of write/erase cycles and small c2 is low and reliable. If on the contrary c2 is high, the quality of the block might be questionable: the latter could however be used for "static data". A block having a large number of write/erase cycles but a small c2 is still reliable. In contrast, if c2 is high, then the block could be phased out.

Figure 6:
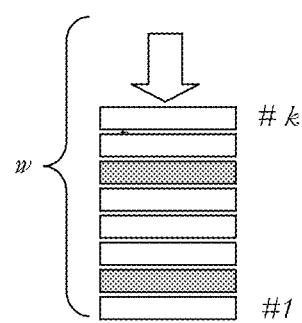
FIG. 6 depicts monitoring of the rate of errors within a block according to the present invention.

Beyond the simple monitoring of errors, the rate of errors can be taken into account. A window of size "W" can be utilized where there are w successive reads in the block. This is symbolically depicted in FIG. 6. Any new read operation (with index k) is added "on top of the window", as denoted by the arrow. Read operations for which an error was detected are denoted by grey boxes (there are two errors in the current window, in the example of FIG. 6). When the number of errors in w exceeds a threshold, the subsequent memory programming is suitably inflected.

This approach can be practically implemented through a counter <r> in the per-block register, which is incremented upon each read operation in the block, and reset when "r" reaches "w". In other words, the window has a maximum of w consecutive read operations. Monitoring errors in such a window amounts to the monitoring the rate of errors.

To achieve this, one may proceed as follows. Upon resetting <r>, another counter <n> in the per-block register is incremented. Another counter <e> in the per-block register is incremented upon each ECC error occurring upon a read operation in the block, and reset when "r" reaches "w". Before resetting it, "e" is kept in another counter location <e_previous> in the per-block register.

Thus, the first w reads form the first window, denoted by w_1, the subsequent w reads form the second window, denoted by w_2, and so forth. Consequently, window w_n contains the $(n-1)*w+1, (n-1)*w+2, \ldots, n*w$ sequence of w successive reads.

The rate of errors and change in rate of errors based on the above can for instance be calculated as follows: r_n=rate of errors in w_n=e/w. To monitor a change in the rate of errors, the following can be computed:

$$r\_(n-1) = \text{rate of errors in } w\_(n-1) = e\_previous/w.$$

$$d\_n = \text{change in rate in } w\_n = r\_n - r\_(n-1).$$

There is a similar way of keeping track of rates at the die level through an additional per-die register. In particular, a window of size "W" can be utilized where there are W successive reads in the die. This can be implemented through another counter <R> in the per-die register, which is incremented upon each read operation in the die, and reset when "R" reaches "W". Upon reset, another counter <N> is incremented in the per-die register. Another counter <E> in the per-die register is incremented upon each ECC error occurring upon a read operation in any block, and reset when "R" reaches "W". Before resetting it, one can keep it in another counter location <E_previous> in the per-die register.

Thus, the first W reads from the first window, denoted by W_1, the subsequent W reads from the second window, etc. Consequently, just as at the block level, window W_N contains the $(N-1)*W+1, (N-1)*W+2, \ldots, N*W$ sequence of W successive reads. The rate of errors and change in rate of errors can be calculated following the same indications given as to the block level.

Examples of data pertaining to per-block registers are aggregated in table 1. Examples of per-die registers data are aggregated in table 2.

TABLE 1

Example of data pertaining to per-block registers

| Block ID | r: number of reads in the block | c1, c2: errors in block according to threshold | e: counter of errors in per-block interval w | n: number of per-block intervals |
|---|---|---|---|---|
| 123 | 100 | 5, 12 | 15 | 4002 |

TABLE 2

Example of data pertaining to per-die registers

| Die ID | R: number of reads in the die | E: counter of errors in per-die interval W | N: number of per-die intervals |
|---|---|---|---|
| 35 | 10656 | 156 | 10002 |

Note that n, the number of per-block intervals may be defined in terms of a successive number of read operations. Depending on the monitoring variant chosen, not all the data as exemplified above needs to be maintained in registers.

Based on the counters described above, and for a particular die, the number of blocks that have reached a given threshold of allowable ECC at a given time is the number of block registers for which the corresponding c2 counter is larger than zero. Note also that for each block, the corresponding counter c2 reflects its history because it indicates how many times the block has reached the threshold of allowable ECC.

By monitoring c2, an accurate view can be obtained of how close a given block is to its end of life. If c2 is small, the corresponding block has not been much used so far. If c2 is large, then the block has been used more often and may be close to end of life and should therefore be used with care or be marked as a bad block.

Many variations can still be contemplated. For instance, consider c1 only or a derivative of c2 as indicator of the age and quality of a block. ECC-related information can be used such as one computed above at the die or the unit level, and not at a block level.

Figure 4:
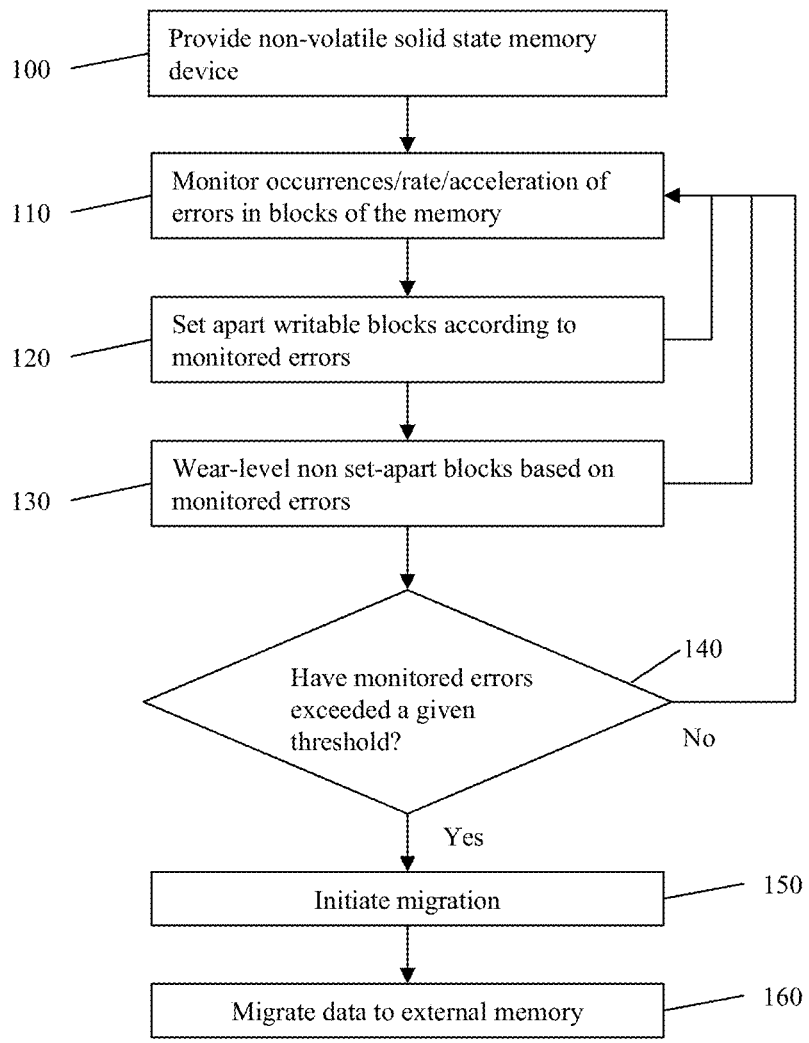
FIG. 4 shows a flowchart illustrating details of an embodiment according to the present invention.
Figure 5:
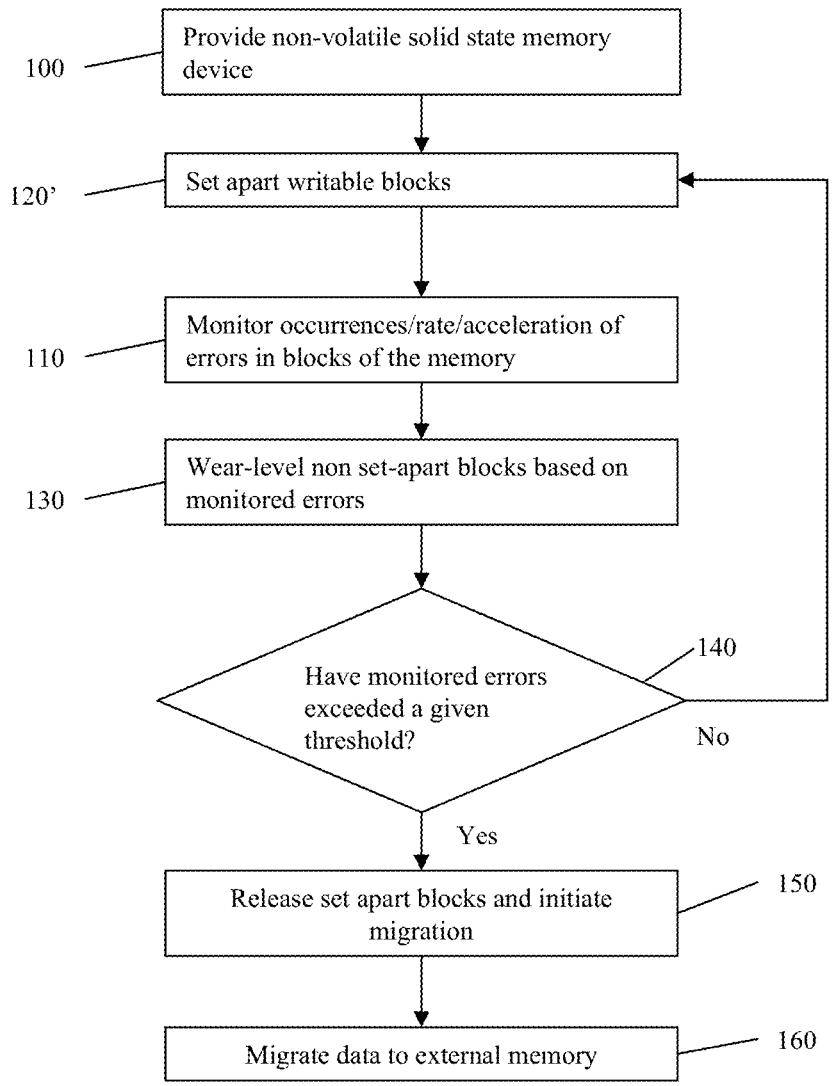
FIG. 5 illustrates a variant to FIG. 4.

As depicted in FIGS. 4 and 5, the method may further include a step of setting apart writable blocks of the memory unit. Subsequent programming (e.g. wear-leveling) would then take account of the status of the blocks, i.e. whether they are set apart or not. The blocks set apart can therefore be used e.g. in case of detection of abrupt depletion of writable space.

In the embodiment shown in FIG. 4, writable blocks are dynamically set apart (step 120). More specifically, errors are monitored just as in the previous embodiments (step 110). Yet, writable blocks can be set apart or the number thereof can be refined according to a current state of monitored errors (step 120). In subsequent steps, wear-leveling (or any memory programming) occurs only for those blocks which are distinct from the blocks set apart (step 130).

Steps 110, 120, and 130 are typically interlaced: the number of blocks set apart is dynamically refined while wear-level occurs for remaining blocks, based on monitored errors.

Next, in case where the monitored errors exceeds a given threshold (decision 130), a migration may be initiated (step 150). This is particularly advantageous in case where a threshold exceeded is indicative of an abrupt depletion of writable space (i.e. amongst the block used by wear-leveling). Initiating data migration may then include releasing the blocks previously marked as set apart. Data can thus first be transferred to the released blocks (step 150). The safety space is for instance used for the gradual migration of data when the device is perceived to be close to its lifetime limit.

Figure 7:
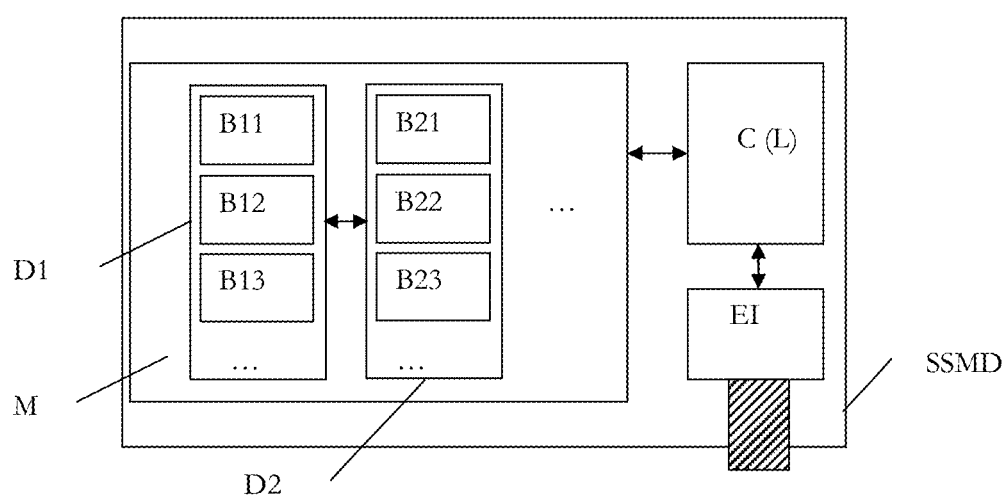
FIG. 7 depicts the configuration of a non-volatile solid state memory device (SSMD) according to the present invention.

The method can be implemented inside a non-volatile solid state memory device SSMD (FIG. 7). The device is then provided with controller C. The controller is generally configured to execute instructions and process write commands and read commands so as to write to and read from the memory M. In particular, the controller is provided with a logic (L) for programming (e.g. writing/erasing) and a memory unit M according to the present method, as depicted in FIG. 7.

As discussed earlier, the device can actually include one or more such memory units M. Each unit subdivides into n dice Dn, which includes m blocks, denoted by Bnm. Incidentally, blocks can be further subdivided into pages and cell. The solid state memory device at stake is for instance a flash memory. Information is ultimately stored in memory cells, e.g. made from floating-gate transistors. Single- or multi-level cell (SLC/MLC) devices can be utilized.

The device SSMD further contains an external interface (EI) which can be an electrical circuit supporting communication with a device external to the device SSMD. The interface may, for example, be a common interface such as Universal Serial Bus, Secure Digital, Compact Flash and the like.

In a variant, the logic (L) is externalized. More generally, the present invention applies to any computerized having a non-volatile solid state memory device with memory units and data stored thereon. Data can be readable through read queries. Error-correcting codes (ECC) for correcting potential errors in the data read are stored together with the data. Coupled to the memory units are computer program code means, which when executed on a computer, allows for the programming (e.g. writing/erasing) of the memory unit according to the method discussed earlier.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A non-volatile solid state memory device comprising:
a memory unit having (i) stored data which is readable using a read operation; and (ii) an error-correcting code for correcting a potential error in said data;
a controller with a logic for programming said memory unit according to a monitored occurrence of said error during said read operation, by monitoring end of life blocks stored in the memory unit;
a first counter coupled to the controller and associated with a first block in the memory unit, the first counter being configured to count the accumulated number of errors since a second counter was last incremented, wherein the first counter is reset at the being nine of each of a plurality of write-erase cycles of the memory unit; and
the second counter coupled to the first counter and configured to count the number of times a threshold is exceeded within the write-erase cycles by counting the number of times the first counter exceeds the threshold, wherein a predetermined count by the second counter indicates that an end of life of the first block has been reached.

2. The device according to claim 1, wherein said read operation comprises monitoring the rate of errors.

3. The device according to claim 1, wherein said memory unit is subdivided into die, each comprising at least one block, wherein said read operation is carried out for each block in each die by maintaining a per-block counter of said occurrence of said error.

4. The device according to claim 1, wherein said read operation comprises monitoring an error in a window of a maximum consecutive read operations.

5. The device according to claim 1, wherein:
said memory unit maintains a per-block counter of write-erase data; and
said controller logic is carried out in response to both error monitored and write-erase data maintained.

6. The device according to claim 1, wherein said memory unit is subdivided into dice, each die comprising at least one block.

7. The device according to claim 6, wherein said memory is configured to set apart a block of said memory unit, and implement wear-leveling for a block that is distinct from said block that has been set apart.

8. The device according to claim 7, wherein said setting apart a block is performed independent of the number of said errors monitored or the number of write-erase operations performed in each block of said memory unit.

9. The device according to claim 7, wherein said setting apart a block is decided or refined based on the number of errors monitored or write-erase data maintained.

10. The device according to claim 6, wherein:
said memory unit sets apart a block of said memory unit; and
said controller logic comprises releasing and using said block that has been set apart, wherein releasing and using said block that has been set apart is performed if said monitored occurrence of an error or rate of errors exceeds a threshold indicative of a depletion of writable memory space in said memory unit.

11. The device according to claim 10, wherein said controller logic initiates a migration of data towards another memory device, wherein initiating a migration of data towards another memory device is performed if said monitored occurrence or said rate of errors exceeds a threshold indicative of a depletion of writable memory space in said memory unit.

12. A computer system for managing a memory of a non-volatile solid state memory device by balancing write/erase cycles among blocks to level block usage, said system comprising:
a non-volatile solid state memory device with a memory unit having stored therein data that is readable by a read operation and is correctable using error-correcting code; and
a non-transitory article of manufacture tangibly embodying computer readable instructions which, when implemented, cause said computer system to carry out the steps of a method of managing said memory unit of said non-volatile solid state memory device, wherein said method comprises the steps of:
monitoring an occurrence of an error during said read operation in said memory unit of said device;
monitoring a first counter coupled to the controller and associated with a first block in the memory unit, the first counter being configured to count the accumulated number of errors since a second counter was last incremented, wherein the first counter is reset at the being nine of each of a plurality of write-erase cycles of the memory unit;
monitoring the second counter coupled to the first counter and configured to count the number of times a threshold is exceeded within the write-erase cycles by counting the number of times the first counter exceeds the threshold, wherein a predetermined count by the second counter indicates that an end of life of the first block has been reached;
marking the first block as bad in response to the predetermined count having been reached by the second counter; and
programming said memory unit according to said monitored occurrence of said error;
wherein the step of monitoring the occurrence of said error is carried out for at least one said block; and
wherein said step of programming comprises wear-leveling said monitored block according said error monitored for said monitored block.

13. The computer system according to claim 12, wherein said step of monitoring the occurrence of an error comprises monitoring the rate of errors.

14. The computer system according to claim 12, wherein said memory unit is subdivided into dies, each die comprising at least one block, wherein said step of monitoring the occurrence of an error is carried out for each block of each die by maintaining a per-block counter of the occurrence of said error.

15. The computer system according to claim 12, wherein said step of monitoring the occurrence of an error comprises: monitoring an error in a window of a maximum consecutive read operations.

16. The computer system according to claim 12, further comprising:
maintaining a per-block counter of write-erase data, and
wherein said step of programming said memory is carried out according to both said error monitored and said write-erase data maintained.

17. The computer system according to claim 12, wherein said memory unit is subdivided into dies, each die comprising at least one block.

18. The computer system according to claim 17, where the method further comprises:
setting apart a writable block of said memory unit, wherein wear-leveling is implemented for a block that is distinct from said block that has been set apart.

19. The computer system according to claim 18, wherein setting apart a writable block is performed independent of the number of said errors monitored or the number of write-erase operations performed in each block of said memory unit.

20. The computer system according to claim 18, wherein setting apart a writable block is decided or refined based on the number of errors monitored or write-erase data maintained.

21. The computer system according to claim 17, wherein the method further comprises:
setting apart a writable block of said memory unit; and
releasing said block that has been set apart if said monitored occurrence of an error or rate of errors exceeds a threshold indicative of a depletion of writable memory space in said memory unit.

22. The computer system according to claim 21, wherein the method further comprises:
initiating a migration of data towards another memory device if said monitored occurrence or said rate of errors exceeds a threshold indicative of a depletion of writable memory space in said memory unit.

* * * * *